(12) United States Patent
Maccarrone et al.

(10) Patent No.: US 10,819,296 B2
(45) Date of Patent: Oct. 27, 2020

(54) APPARATUS FOR RECEIVING OR TRANSMITTING VOLTAGE SIGNALS

(71) Applicant: MICRON TECHNOLOGY, INC., Boise, ID (US)

(72) Inventors: Agatino Massimo Maccarrone, Regalbuto (IT); Luigi Pilolli, L'Aquila (IT)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 16/361,799

(22) Filed: Mar. 22, 2019

(65) Prior Publication Data

US 2020/0304086 A1 Sep. 24, 2020

(51) Int. Cl.
*H03F 3/45* (2006.01)
*H02J 7/04* (2006.01)
*H03F 3/30* (2006.01)

(52) U.S. Cl.
CPC .......... *H03F 3/45636* (2013.01); *H02J 7/045* (2013.01); *H03F 3/3027* (2013.01)

(58) Field of Classification Search
CPC ................................ H03F 3/456; H02J 7/045
See application file for complete search history.

(56) References Cited

U.S. PATENT DOCUMENTS

| 9,515,605 | B1 * | 12/2016 | Madala | H03B 5/1212 |
| 9,667,252 | B1 * | 5/2017 | Lee | H03K 19/00346 |
| 2004/0239414 | A1 * | 12/2004 | Otake | G05F 3/242 |
| | | | | 327/541 |
| 2010/0001685 | A1 * | 1/2010 | Eastlack | H02J 50/10 |
| | | | | 320/108 |
| 2012/0256691 | A1 * | 10/2012 | Sako | H03B 5/36 |
| | | | | 330/296 |
| 2016/0226451 | A1 * | 8/2016 | Vigraham | H03K 3/037 |

* cited by examiner

*Primary Examiner* — Patricia T Nguyen
(74) *Attorney, Agent, or Firm* — Dicke, Billig & Czaja, PLLC

(57) ABSTRACT

Apparatus useful for receiving or transmitting voltage signals might include a current generator having first and second inputs and configured to generate a current flow between first and second outputs responsive to a voltage difference between its first and second inputs. The apparatus might further include a feedback amplifier having a first input connected to the first output of the current generator, a second input connected to the second output of the current generator, a first voltage signal node connected to its first input through a first resistance, and a second voltage signal node connected to its second input through a second resistance, wherein a first inverter is connected in parallel with the first resistance, a second inverter is connected in parallel with the second resistance, and a pair of cross-coupled inverters are connected between the first voltage signal node and the second voltage signal node.

21 Claims, 10 Drawing Sheets

APPARATUS FOR RECEIVING OR TRANSMITTING VOLTAGE SIGNALS

TECHNICAL FIELD

The present disclosure relates generally to integrated circuit architecture and operation, and, in particular, in one or more embodiments, the present disclosure relates to apparatus for receiving or transmitting voltage signals, often referred to as input or output (I/O) buffer circuits.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Input or output buffer circuits are commonly used in integrated circuit devices to condition received data or strobe signals so as to provide output voltage signals having well-defined logic levels, either for internal use or for transmission to external devices. Such buffer circuits often include some form of differential amplifier responsive to two input voltage signals, such as complementary strobe signals (e.g., differential mode), or a data signal and a reference voltage (e.g., single-ended mode).

A generally important parameter of an I/O buffer is output duty cycle. For example, during read or write operations, setup and hold times for data can be negatively impacted if the duty cycle of clocked data varies too far from expectation, e.g., a duty cycle of 50 percent. As a result, a data valid window may be insufficient to perform the desired operation.

DETAILED DESCRIPTION

Figure 1:
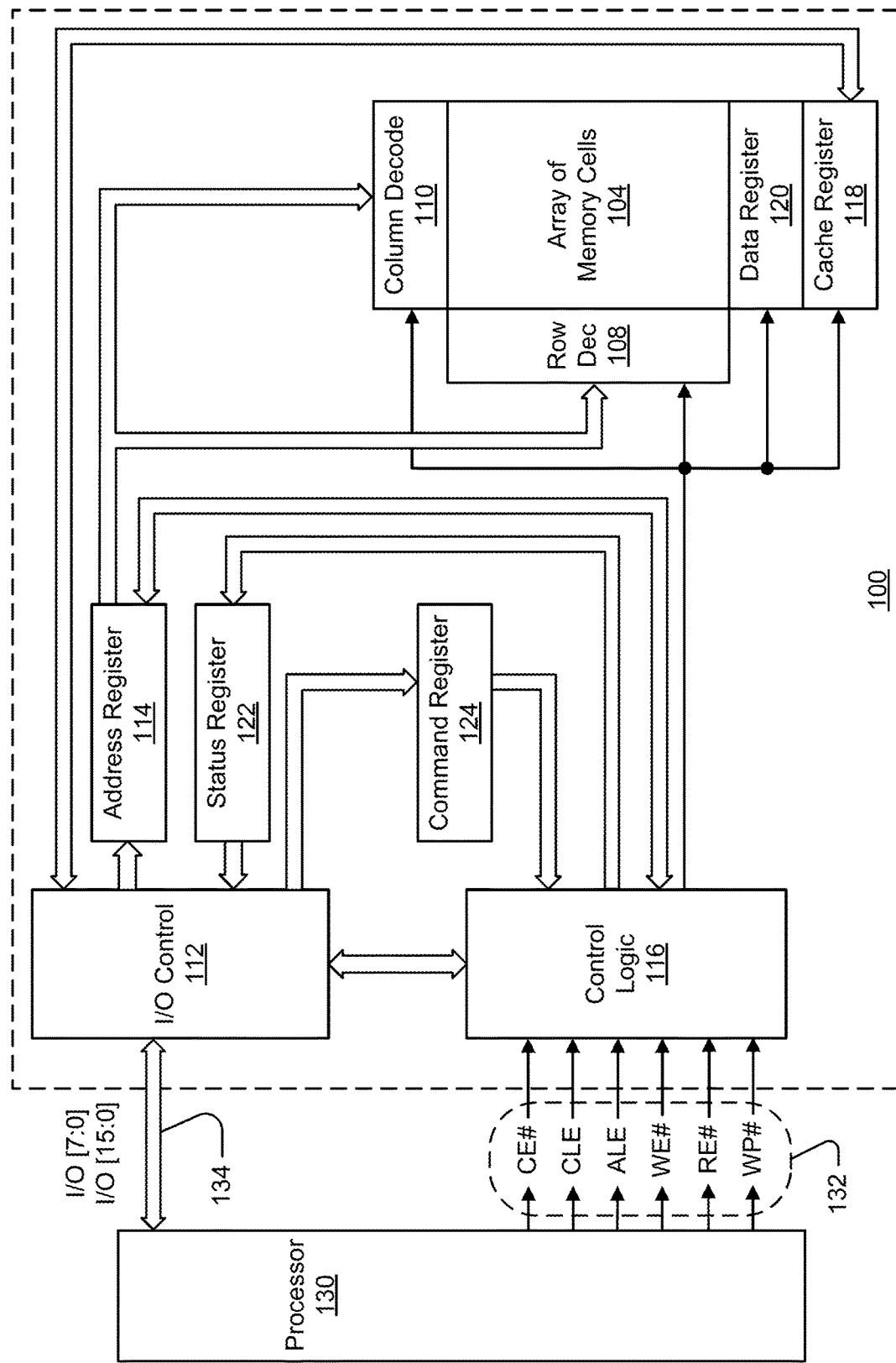
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

Various embodiments will be discussed using the example of an input buffer of a memory device. However, it should be understood that the concepts disclosed herein may also be applied to an output buffer, as well as to other forms of integrated circuit devices.

Input buffer offset can be a significant error source surrounding setup and hold time requirements of the buffer. The setup time ($t_{DS}$) may be defined as the minimum time in advance of the latching clock (e.g., a data strobe) edge that valid data must be present at the buffer's input. The hold time ($t_{DH}$) may be defined as the minimum time following the latching clock edge that the data must be present at the input buffer's input. Together, the setup and hold times define a "window" surrounding the clock edge (rising and/or falling) during which the data on the data line (DQ) must be valid. The values of $t_{DS}$ and fix are often defined by industry, customer or internal standards, typically as minimum periods of time. Integrated circuit devices are typically designed to operate with a margin, or additional time, beyond each of these standards. However, variabilities inherent in typical integrated circuit fabrication can contribute to loss of $t_{DS}/t_{DH}$ margin, and may lead to a failure to operate within these standards. Various embodiments facilitate mitigation of asymmetry commonly found in I/O buffer circuits of the related art.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. The I/O control circuitry 112 may include input and/or output buffer circuitry (not shown in FIG. 1) in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120.

Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
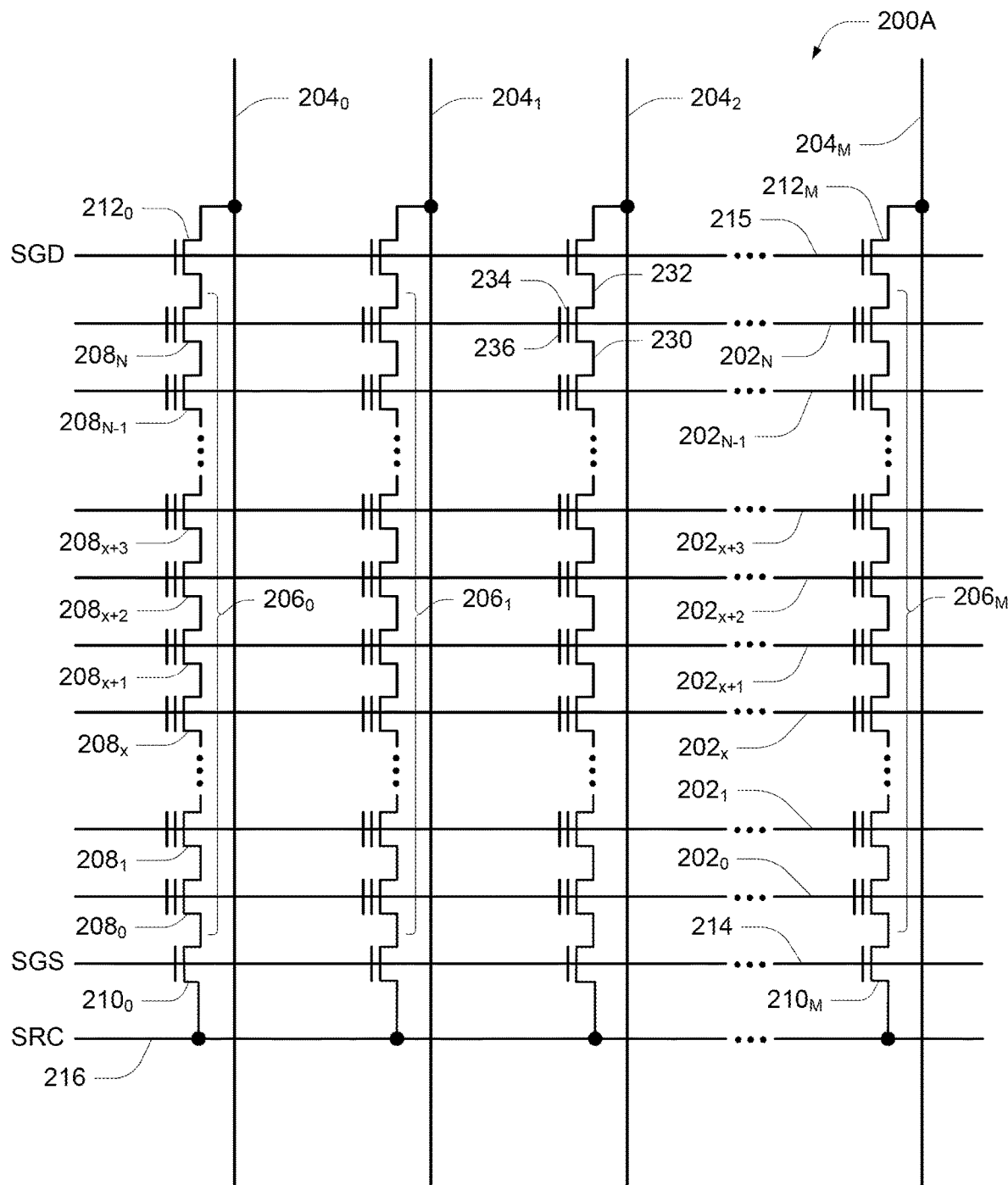
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
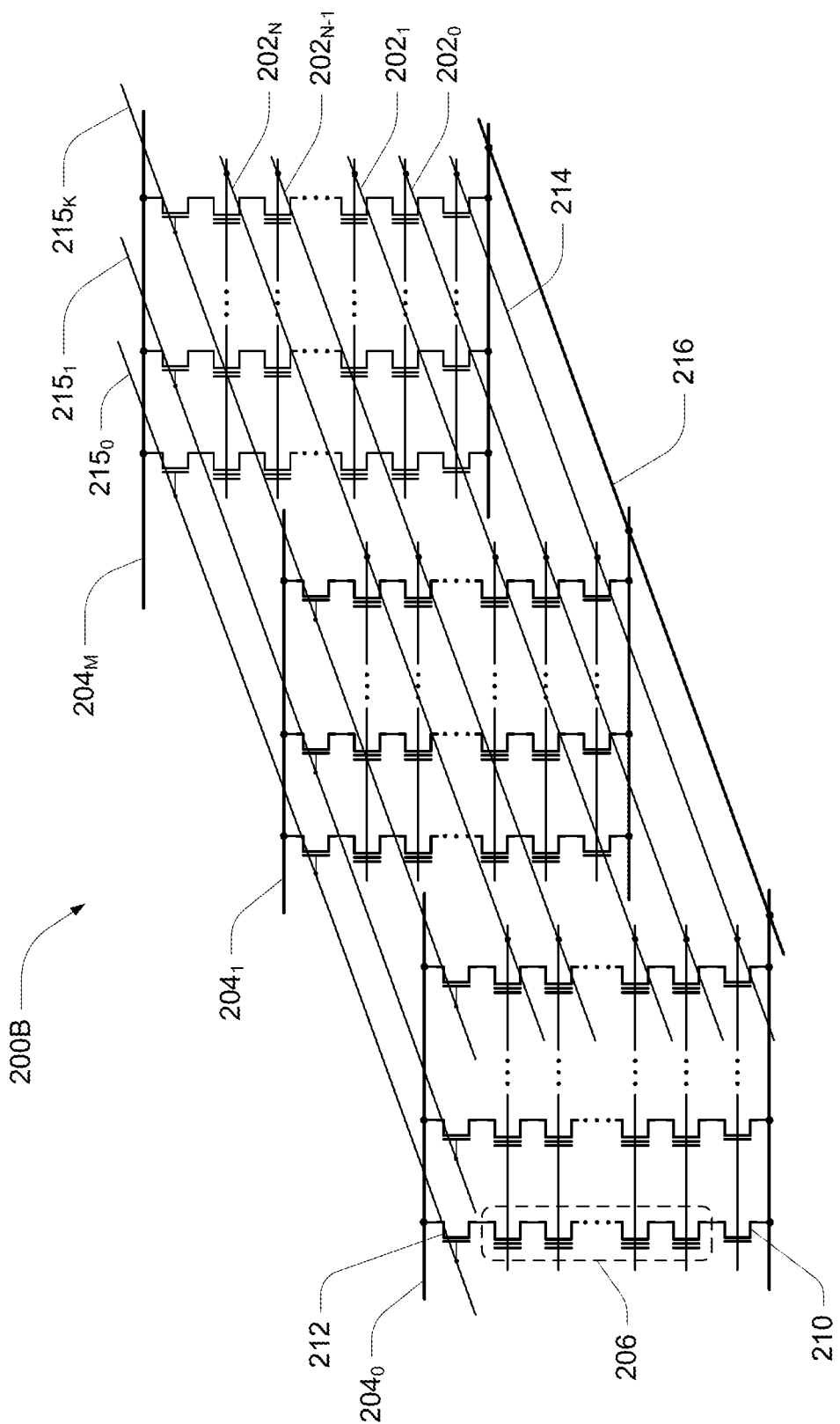

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
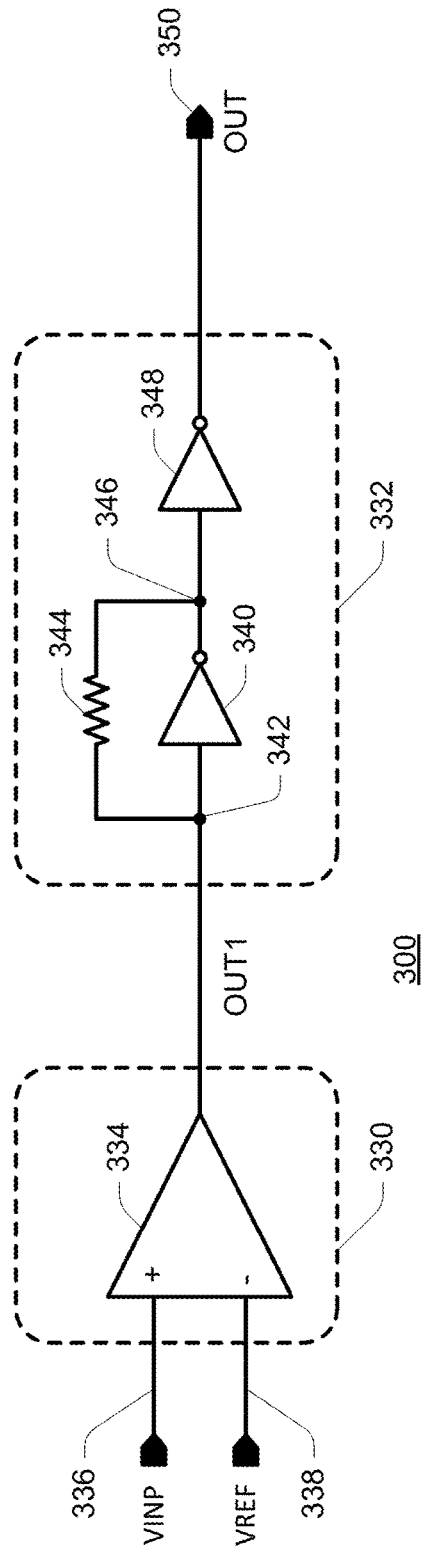
FIG. 3A is a block schematic of a two-stage I/O buffer circuit of the related art.

FIG. 3A is a block schematic of a two-stage I/O buffer circuit 300 of the related art. The I/O buffer circuit 300 might be an input buffer or an output buffer. The I/O buffer circuit 300 includes a first stage 330 and a second stage 332. The first stage 330 might generally act to amplify the input signal and generate a single-ended output, while the second stage 332 might generally act to produce a full logic swing (e.g., rail-to-rail) of the output voltage signal.

The first stage 330 might include a comparator (e.g., a differential amplifier) 334 having a first input 336 (e.g., a non-inverting or "+" input) configured to receive a first voltage signal VINP. The first voltage signal VINP might represent a data signal received from an external device (e.g., across I/O bus 134), or received from internal circuitry, such as a register (e.g., cache register 118) configured to generate a data signal representing data stored in a memory cell (e.g., of an array of memory cells 104). The comparator 334 further includes a second input 338 (e.g., an inverting or "−" input) configured to receive a second voltage signal VREF. The second voltage signal VREF might be a reference voltage signal. For example, where an integrated circuit device is configured to operate using a top rail supply voltage, such as Vcc, and a bottom rail reference potential, such as Vss or ground, the second voltage signal VREF might have a voltage level halfway between the top rail supply voltage and the bottom rail reference potential, e.g., Vcc/2. The comparator 334 further includes an output providing the voltage signal OUT1. For example, if VINP>VREF, the voltage signal OUT1 might have a first logic level (e.g., logic high level), and if VINP<VREF, the voltage signal OUT1 might have a second logic level different than the first logic level (e.g., logic low level).

The I/O buffer circuit 300 further includes a second stage 332. The second stage 332 includes a first inverter 340 connected in parallel with a resistance (e.g., resistor) 344. The resistance 344 might have a first end connected to a node 342 connected to an input of the first inverter 340, and a second end connected to a node 346 connected to an output of the first inverter 340. The second stage 332 further includes a second inverter 348 having an input connected to the output of the first inverter 340, and having an output connected to an output node 350 to provide the voltage signal OUT that may represent a logic level of the voltage signal VINP.

Figure 3B:
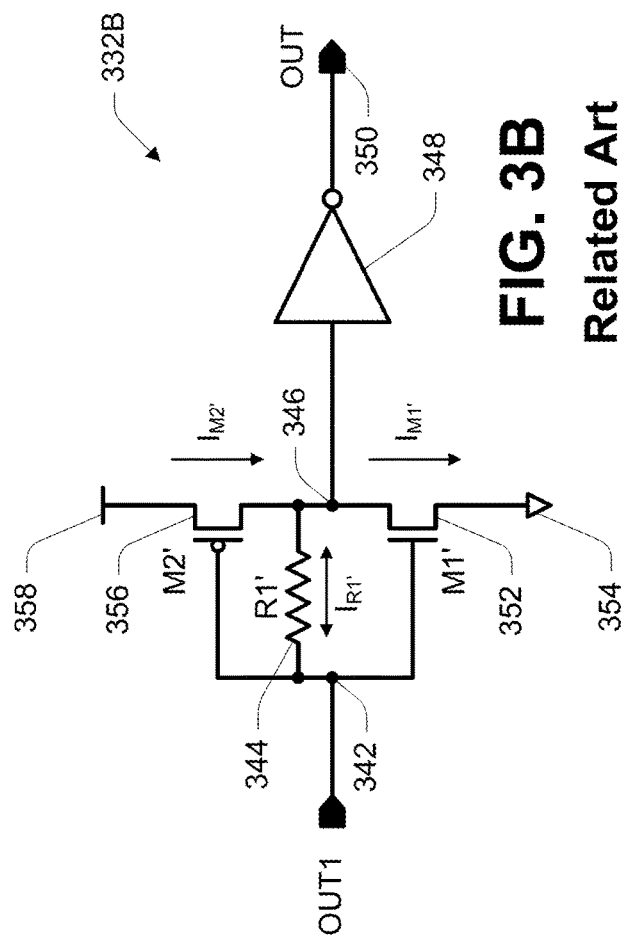
FIG. 3B is a more detailed schematic of a second stage of an I/O buffer circuit of the type depicted in FIG. 3A.

FIG. 3B is a more detailed schematic of a second stage of an I/O buffer circuit of the type depicted in FIG. 3A. In particular, FIG. 3B provides more detail of the first inverter 340 as having an n-type field-effect transistor (nFET) 352 having a control gate connected to the node 342, a first source/drain (e.g., source) connected to a voltage node 354, and a second source/drain (e.g., drain) connected to the node 346. The first inverter 340 is further shown to have a p-type field-effect transistor (pFET) 356 having a control gate connected to the node 342, a first source/drain (e.g., source) connected to a voltage node 358, and a second source/drain (e.g., drain) connected to the node 346. FIG. 3B further depicts current flow as might be expected during operation of an I/O buffer circuit (e.g., I/O buffer circuit 300) containing the second stage 332B. $I_{R1'}$ represents current flow across the resistance 344, $I_{M1'}$ represents current flow across the nFET 352, and $I_{M2'}$ represents current flow across the pFET 356. During operation, if the voltage signal OUT1 has a logic high level, $I_{M2'} + I_{R1'} = I_{M1'}$, while if the voltage signal OUT1 has a logic low level, $I_{M2'} - I_{R1'} = I_{M1'}$.

Figure 4A:
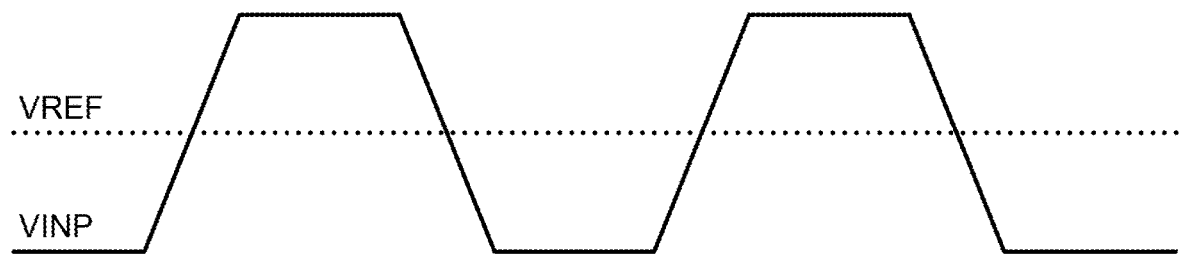
FIGS. 4A-4C are generic wave diagrams conceptually demonstrating I/O buffer circuit behavior of the related art.
Figure 4B:
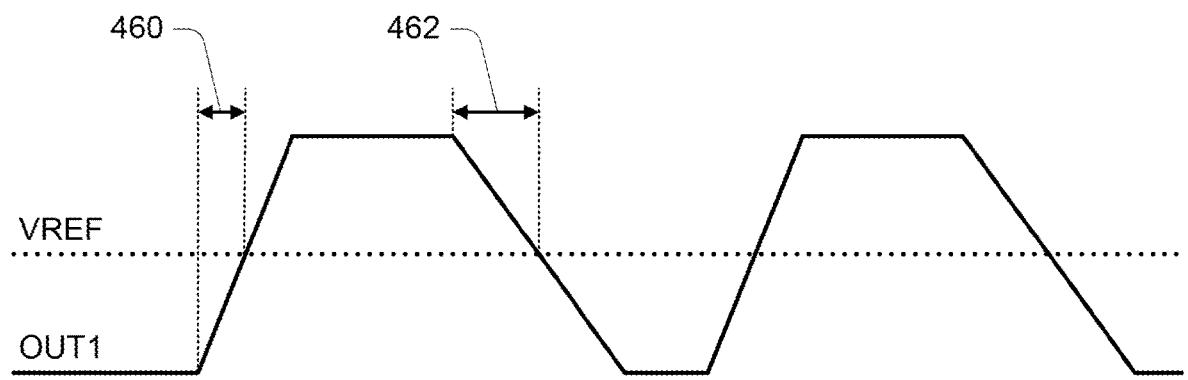
Figure 4C:
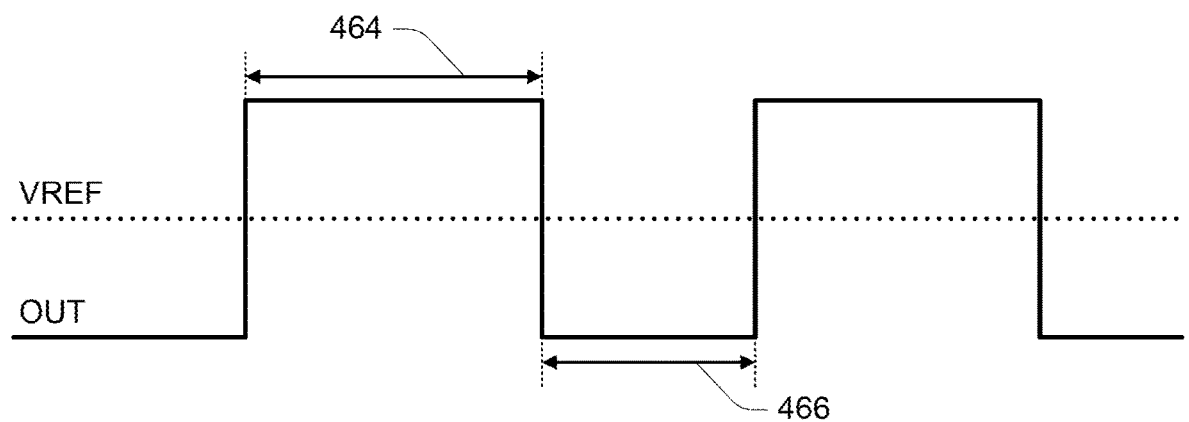

FIGS. 4A-4C are generic wave diagrams conceptually demonstrating I/O buffer circuit behavior of the related art. Comparators (e.g., differential amplifiers) commonly demonstrate asymmetrical behavior, such that the slew rate of its output voltage signal OUT1 in response to a low-to-high transition of the first voltage signal VINP may be different than the slew rate of its output voltage signal OUT1 in response to a high-to-low transition of the first voltage signal VINP. This can negatively impact duty cycle of the I/O buffer circuit.

FIG. 4A depicts a regularly oscillating first voltage signal VINP. FIG. 4B depicts this typical asymmetrical behavior. For example, in response to the first voltage signal VINP transitioning to a higher voltage level than the second voltage signal VREF, the output voltage signal OUT1 may begin to transition higher, and may take time period 460 to transition above the second voltage signal VREF. However, in response to the first voltage signal VINP transitioning to a lower voltage level than the second voltage signal VREF, the output voltage signal OUT1 may begin to transition lower, and may take time period 462 to transition below the second voltage signal VREF, where time period 462 is greater than time period 460. As a result, the time period 464 that the output voltage signal OUT remains at a logic high level following a low-to-high transition of the first voltage signal VINP is greater than the time period 466 that the output voltage signal OUT remains at a logic low level following a high-to-low transition of the first voltage signal VINP. To obtain a desired 50% duty cycle, it would be desired that time period 464 be equal to time period 466.

Figure 5A:
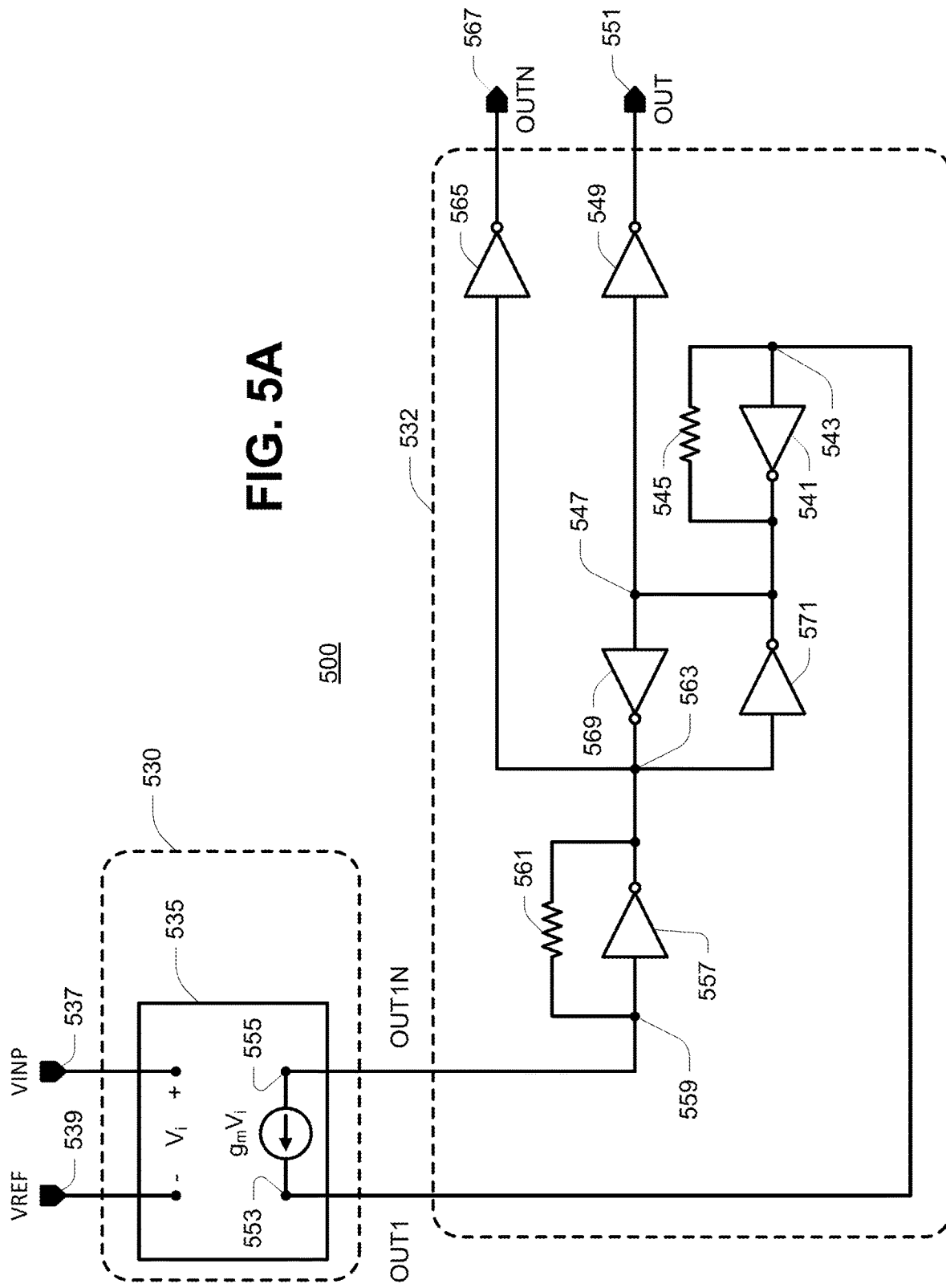
FIG. 5A is a block schematic of a two-stage I/O buffer circuit in accordance with an embodiment.

FIG. 5A is a block schematic of a two-stage I/O buffer circuit 500 in accordance with an embodiment. The I/O buffer circuit 500 might be an input buffer or an output buffer. The I/O buffer circuit 500 includes a first stage 530 and a second stage 532. The first stage 530 might generally act to amplify the input signal and generate a differential output, while the second stage 332 might generally act to produce a full logic swing (e.g., rail-to-rail) of the differential output voltage signals.

The first stage 530 might include a current generator (e.g., a voltage controlled current generator) 535 having a first input 537 (e.g., a non-inverting or "+" input) configured to receive a first voltage signal VINP. The first voltage signal VINP might represent a data signal received from an external device (e.g., across I/O bus 134), or received from internal circuitry, such as a register (e.g., cache register 118) configured to generate a data signal representing data stored in a memory cell (e.g., of an array of memory cells 104). The current generator 535 further includes a second input 539 (e.g., an inverting or "−" input) configured to receive a second voltage signal VREF. The second voltage signal VREF might be a reference voltage signal. For example, where an integrated circuit device is configured to operate using a top rail supply voltage, such as Vcc, and a bottom rail reference potential, such as Vss or ground (e.g., 0V), the second voltage signal VREF might have a voltage level halfway between the top rail supply voltage and the bottom rail reference potential, e.g., Vcc/2. The current generator 535 might further include a first output 553 providing the voltage signal OUT1, and a second output 555 providing the voltage signal OUT1N. The current generator 535 might be configured to generate a current source at its first output 553 and to generate a current sink at its second output 555 when the first voltage signal VINP is higher than the second voltage signal VREF. The current generator 535 might further be configured to generate a current sink at its first output 553 and to generate a current source at its second output 555 when the first voltage signal VINP is lower than the second voltage signal VREF.

The I/O buffer circuit 500 further includes a second stage 532. The second stage 532 might include a first inverter 541 connected in parallel with a first resistance (e.g., resistor) 545. The first resistance 545 might have a first end connected to a node 543 connected to an input of the first inverter 541, and a second end connected to a node 547 connected to an output of the first inverter 541. The second stage 532 might further include a second inverter 557 connected in parallel with a second resistance (e.g., resistor) 561. The second resistance 561 might have a first end connected to a node 559 connected to an input of the second inverter 557, and a second end connected to a node 563 connected to an output of the second inverter 557. The second stage 532 might further include a third inverter 569 having an input connected to the node 547 and an output connected to the node 563. The second stage 532 might further include a fourth inverter 571 having an input connected to the node 563 and an output connected to the node 547.

The second stage 532 might further include a fifth inverter 549 having an input connected to the node 547 and an output connected to the first output 551 to provide the output voltage signal OUT that may represent a logic level of the voltage signal VINP. The second stage 532 might further include a sixth inverter 565 having an input connected to the node 563 and an output connected to the second output 567 to provide the output voltage signal OUTN that may represent a complement of the logic level of the voltage signal VINP.

Figure 5B:
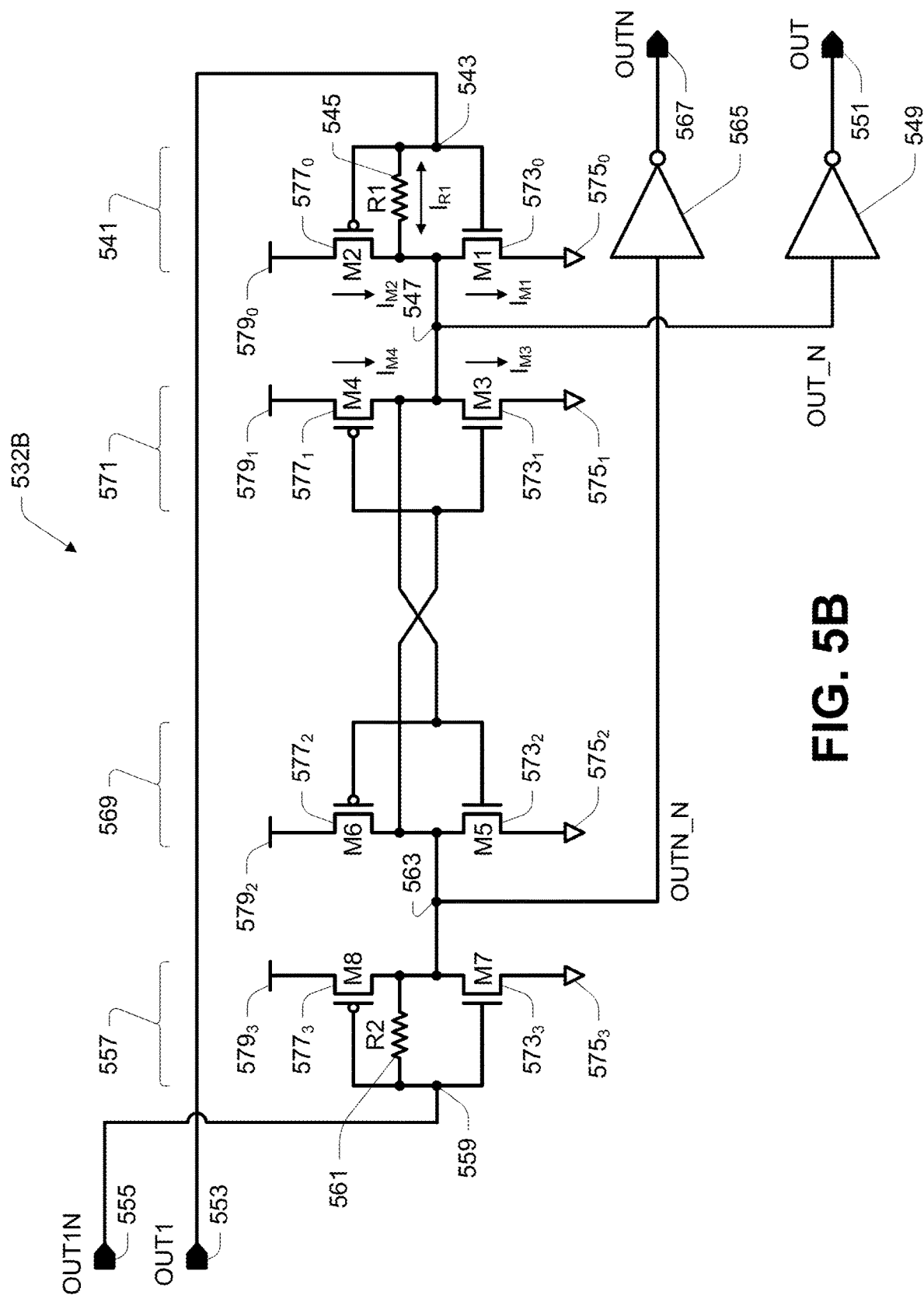
FIG. 5B is a more detailed schematic of a second stage of an I/O buffer circuit of the type depicted in FIG. 5A in accordance with an embodiment.

FIG. 5B is a more detailed schematic of a second stage of an I/O buffer circuit of the type depicted in FIG. 5A. In particular, FIG. 3B provides more detail of the inverters 541, 557, 569 and 571. For example, the first inverter 541 might include a first nFET $573_0$ having a control gate connected to the node 543, a first source/drain (e.g., source) connected to a voltage node $575_0$, and a second source/drain (e.g., drain) connected to the node 547. The first inverter 541 might further include a first pFET $577_0$ having a control gate connected to the node 543, a first source/drain (e.g., source) connected to a voltage node $579_0$, and a second source/drain (e.g., drain) connected to the node 547. The fourth inverter 571 might include a second nFET $573_1$ having a control gate connected to the node 563, a first source/drain (e.g., source) connected to a voltage node $575_1$, and a second source/drain (e.g., drain) connected to the node 547. The fourth inverter 571 might further include a second pFET $577_1$ having a control gate connected to the node 563, a first source/drain (e.g., source) connected to a voltage node $579_1$, and a second source/drain (e.g., drain) connected to the node 547.

The third inverter 569 might include a third nFET $573_2$ having a control gate connected to the node 547, a first source/drain (e.g., source) connected to a voltage node $575_2$, and a second source/drain (e.g., drain) connected to the node 563. The third inverter 569 might further include a third pFET $577_2$ having a control gate connected to the node 547, a first source/drain (e.g., source) connected to a voltage node $579_2$, and a second source/drain (e.g., drain) connected to the node 563. The second inverter 557 might include a fourth nFET $573_3$ having a control gate connected to the node 559, a first source/drain (e.g., source) connected to a voltage node $575_3$, and a second source/drain (e.g., drain) connected to the node 563. The second inverter 557 might further include a fourth pFET $577_3$ having a control gate connected to the node 559, a first source/drain (e.g., source) connected to a voltage node $579_3$, and a second source/drain (e.g., drain) connected to the node 563. The voltage nodes $575_0$-$575_3$ might represent a common voltage node, or might otherwise be configured to receive a same voltage level, e.g., a bottom rail reference potential, e.g., Vss or ground. The voltage nodes $579_0$-$579_3$ might represent a common voltage node, or might otherwise be configured to receive a same voltage level, e.g., a top rail supply voltage, e.g., Vcc.

FIG. 5B further depicts current flow as might be expected during operation of an I/O buffer circuit (e.g., I/O buffer circuit 500) containing the second stage 532B. $I_{R1}$ represents current flow across the resistance 545 (or R1), $I_{M1}$ represents current flow across the nFET $573_0$ (or M1), $I_{M2}$ represents current flow across the pFET $577_0$ (or M2), $I_{M3}$ represents current flow across the nFET $573_1$ (or M3), and $I_{M4}$ represents current flow across the pFET $577_1$ (or M4). During operation, if the voltage signal OUT1 is maintained at a logic high level, the following steady-state relationship might be expected: $I_{M2}+I_{R1}=I_{M1}+I_{M3}$, where the pFET $577_1$ might be expected to be deactivated. If the voltage signal OUT1 is maintained at a logic low level, the following steady-state relationship might be expected: $I_{M1}+I_{R1}=I_{M2}+I_{M4}$, where the nFET $573_1$ might be expected to be deactivated. Similar relationships might be expected for inverters 557 and 569, as depicted in FIG. 5B, responsive to the voltage signal OUT1N.

Figure 6A:
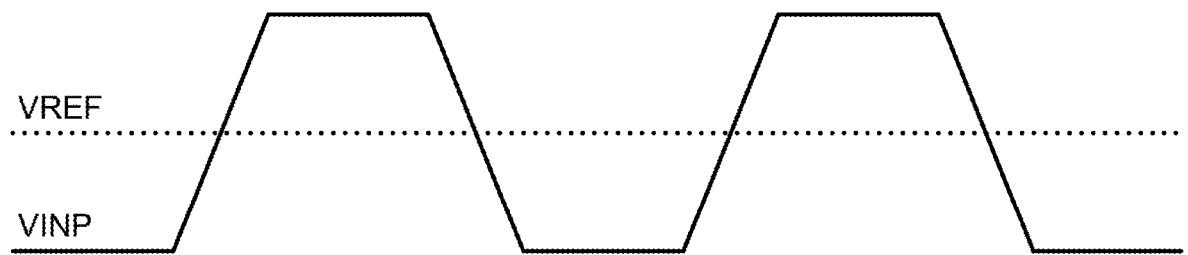
FIGS. 6A-6C are generic wave diagrams conceptually demonstrating I/O buffer circuit behavior in accordance with an embodiment.
Figure 6B:
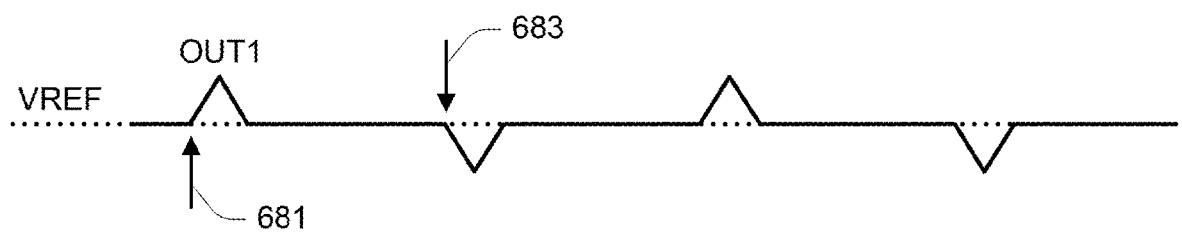
Figure 6C:
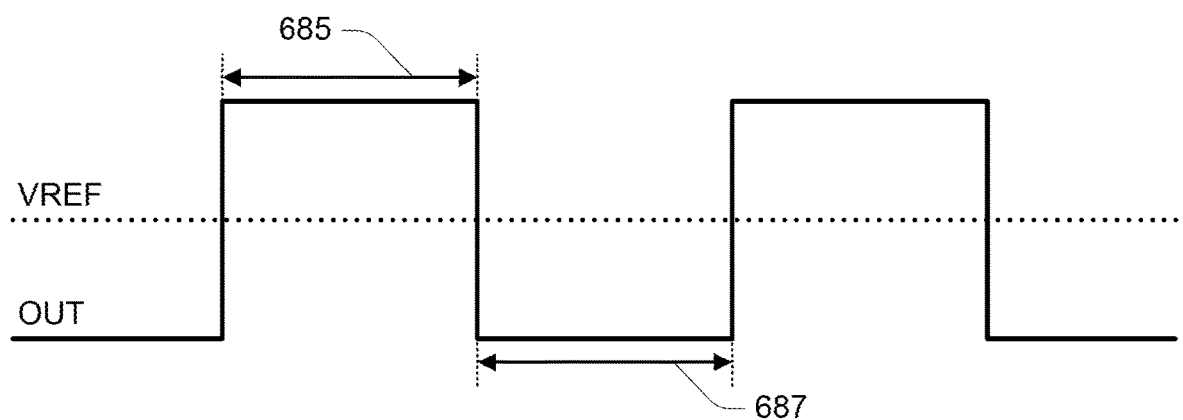

FIGS. 6A-6C are generic wave diagrams conceptually demonstrating I/O buffer circuit behavior in accordance with an embodiment. In general, the differential (e.g., fully differential) architecture of the I/O buffer circuit 500 may serve to mitigate asymmetrical behavior as often seen in single-ended signal of a comparator such as in the I/O buffer circuit 300 of the related art. In particular, the differential architecture may tend to bring the dual output voltage signals OUT1 and OUT1N of the first stage 530 to steady-state voltage levels that are equal to, or near, the reference voltage signal VREF. By doing so, transitions in the logic levels of the output voltage signals OUT and OUTN might be facilitated by only slight perturbations from their steady-state values, which might serve to provide more symmetrical behavior in response to low-to-high and high-to-low transitions of the voltage signal VINP.

FIG. 6A depicts a regularly oscillating first voltage signal VINP. FIG. 6B depicts a generally symmetrical behavior that might be facilitated using a differential architecture in accordance with an embodiment. For example, if the first voltage signal VINP has a logic low level, the inverters 541 and 571, in conjunction with the resistance 545, might be expected to exhibit the steady-state relationship $I_{M1}+I_{R1}=I_{M2}+I_{M4}$. As the first voltage signal VINP begins to increase above its steady-state value, the voltage signal OUT1 might begin to charge at 681, e.g., due to current flow from the node 547 through the resistance 545 along with a decrease in current sink to the current generator 535, and the transitional relationship might be $I_{M1}=I_{M2}+I_{M4}+I_{R1}$, leading to a decrease in the voltage level at the node 547. Concurrently, the voltage signal OUT1N might begin to discharge, e.g., due to current flow to the node 563 through the resistance 561 along with a decrease in current sourced from the current generator 535. The decrease in the voltage level at the node 547 and increase in the voltage level of the voltage signal OUT1, and a corresponding increase in the voltage level at the node 563 and decrease in the voltage level of the voltage signal OUT1N, will generally lead to an inversion in the currents flowing through the resistances 545 and 561, respectively. The inverter 571 might then transition to deactivate its pFET $577_1$, and to activate its nFET $573_1$, and the inverters 541 and 571, in conjunction with the resistance 545, might be expected to exhibit the steady-state relationship $I_{M1}+I_{M3}=I_{M2}+I_{R1}$ at a decreased voltage level at the node 547. A corresponding (e.g., complementary) effect on the inverters 557 and 569 may concurrently occur. The voltage signals OUT1 and OUT1N might then seek to return to their steady-state values due to what might be considered an auto-regulation mechanism of the nFET $573_0$ and the pFET $577_0$, as part of the current sunk by the nFET $573_0$ might be sunk by the nFET $573_1$. However, as a result of the decrease in voltage level at the node 547, the output voltage signal OUT might transition from a logic low level to a logic high level.

Conversely, if the first voltage signal VINP has a logic high level, the inverters 541 and 571, in conjunction with the resistance 545, might be expected to exhibit the steady-state relationship $I_{M1}+I_{M3}=I_{M2}+I_{R1}$. As the first voltage signal VINP begins to decrease below its steady-state value, the voltage signal OUT1 might begin to discharge at 683, e.g., due to current flow to the node 547 through the resistance 545 along with a decrease in current sourced from the current generator 535, and the transitional relationship might be $I_{M2}=I_{M1}+I_{M3}+I_{R1}$, leading to an increase in the voltage level at the node 547. Concurrently, the voltage signal OUT1N might begin to charge, e.g., due to current flow from the node 563 through the resistance 561 along with a decrease in current sink to the current generator 535. The increase in the voltage level at the node 547 and decrease in the voltage level of the voltage signal OUT1, and a corresponding decrease in the voltage level at the node 563 and increase in the voltage level of the voltage signal OUT1N, will generally lead to an inversion in the currents flowing through the resistances 545 and 561, respectively. The inverter 571 might then transition to deactivate its nFET $573_1$, and to activate its pFET $577_1$, and the inverters 541 and 571, in conjunction with the resistance 545, might be expected to exhibit the steady-state relationship $I_{M1}+I_{R1}=I_{M2}+I_{M4}$ at an increased voltage level at the node 547. A corresponding (e.g., complementary) effect on the inverters 557 and 569 may concurrently occur. The voltage signals OUT1 and OUT1N might seek to return to their steady-state values due to what might be considered an auto-regulation mechanism of the nFET $573_0$ and the pFET $577_0$, as part of the current sourced by the pFET $577_0$ might be sourced by the pFET $577_1$. However, as a result of the increase in voltage level at the node 547, the output voltage signal OUT might transition from a logic high level to a logic low level.

Note that through the use of a current generator, the transition of the voltage signal OUT1 can begin in response to the first voltage signal VINP beginning its transition to a higher (or lower) voltage level, and would not require waiting until it increases to a level higher than (or lower than, respectively) the second voltage signal VREF as would generally be the case in architectures of the related art. Consequently, transitions of the output voltage signal OUT, as well as the output voltage signal OUTN, might respond more rapidly to changes in the first input voltage signal VINP over architectures of the related art utilizing a comparator. In addition, as transitions of the output voltage signal OUT may be triggered in response to mere changes in the voltage level of the first voltage signal VINP rather than requiring transitions above or below the second voltage signal VREF, the time period 685 that the output voltage signal OUT remains at a logic high level following a low-to-high transition of the first voltage signal VINP may be substantially equal to the time period 687 that the output voltage signal OUT remains at a logic low level following a high-to-low transition of the first voltage signal VINP, which might facilitate duty cycles near 50%.

Figure 7:
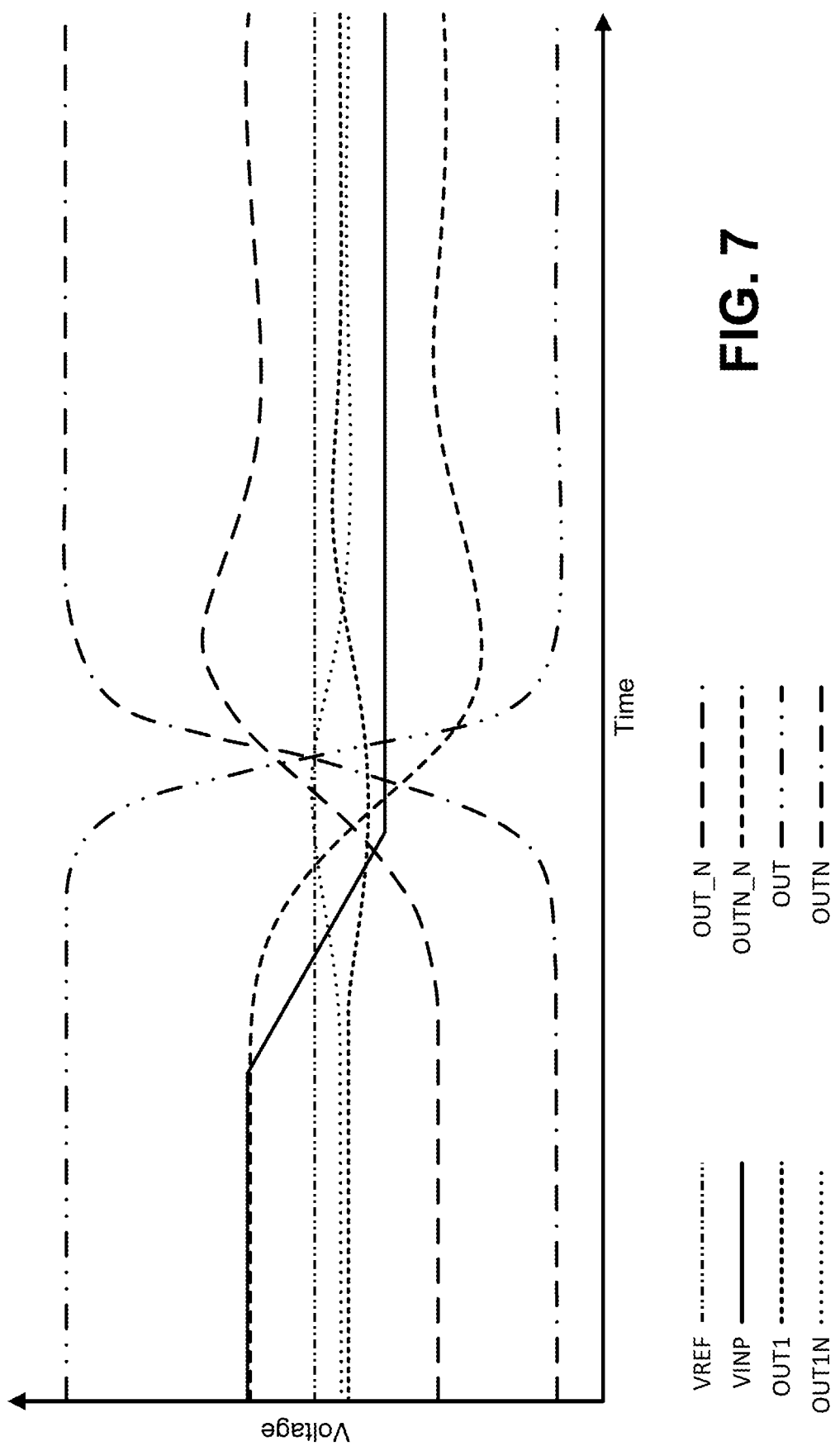
FIG. 7 represents simulated wave diagrams of I/O buffer circuit behavior in accordance with an embodiment.

Although the discussion of FIGS. 6A-6C generally referred to the responses of the voltage signal OUT1 and the output voltage signal OUT, the concepts discussed could similarly be applied to the voltage signal OUT1N and the output voltage signal OUTN, e.g., with complementary logic levels. FIG. 7 represents simulated wave diagrams of I/O buffer circuit behavior in accordance with an embodiment. In particular, FIG. 7 may depict expected behavior at nodes 553 (OUT1), 555 (OUT1N), 547 (OUT_N), 563 (OUTN_N), 551 (OUT), and 567 (OUTN). In the example depicted in FIG. 7, the voltage signals OUT1 and OUT1N might have steady-state values within 20% of the second voltage signal VREF, e.g., 0.8*VREF<=OUT1 or OUT1N<=1.2*VREF. The steady-state value of the voltage signal OUT1 might be substantially equal to (e.g., equal to) the steady-state value of the voltage signal OUT1N.

Figure 8A:
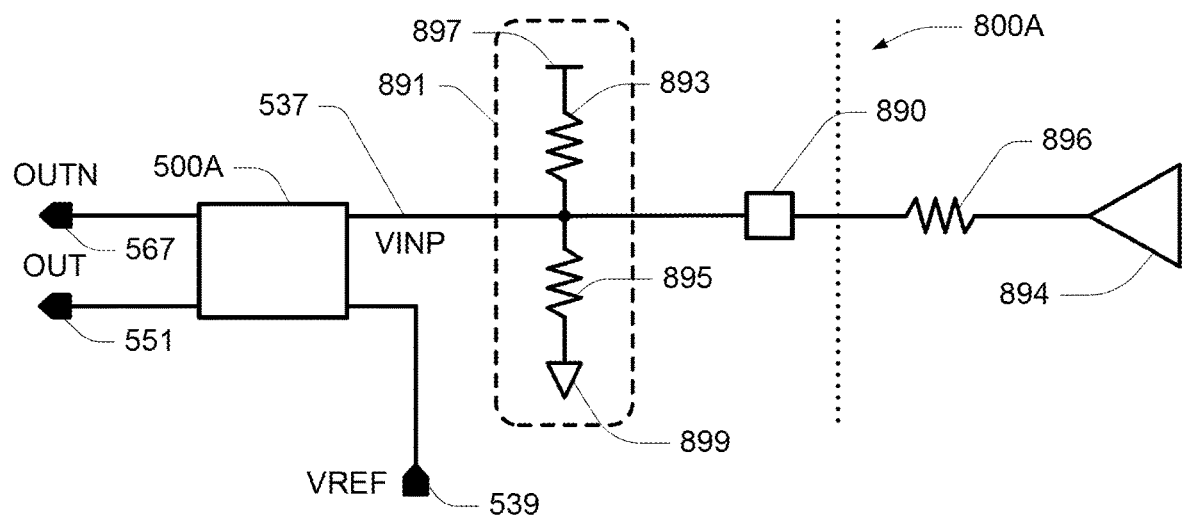
FIG. 8A is a block schematic of an apparatus including an input buffer in accordance with an embodiment.

I/O buffer circuits in accordance with embodiments might be used as input buffer circuits, where VINP might represent a voltage signal received from an external device. FIG. 8A is a block schematic of an apparatus including an input buffer circuit in accordance with an embodiment.

In particular, FIG. 8A is a block schematic of a portion of an apparatus 800A (e.g., a memory device or other integrated circuit device) having an input buffer circuit 500A in accordance with an embodiment. The input buffer circuit 500A may have a first input 537 configured to connect to a conductive node 890 (e.g., conductive pad or other electrical connection for an external device) through an on-die termination (ODT) device 891. The ODT device 891 is represented as a pull-up resistance 893 (e.g., a pull-up termination device) and a pull-down resistance 895 (e.g., a pull-down termination device) connected between a voltage node 897 (e.g., configured to receive a top rail supply voltage such as Vcc) and a voltage node 899 (e.g., configured to receive a bottom rail reference potential such as Vss or ground). While typical configurations of ODT will often utilize multiple pull-up or pull-down resistances selectively connected in parallel (compare FIG. 3 of U.S. Pat. No. 9,621,160 B2 to Q. Tang) to facilitate calibration (e.g., ZQ calibration) to a desired impedance, the configuration of ODT device 891 is not important to the disclosed embodiments, and may be eliminated. As an example, the ODT device 891 could represent any circuit configuration intended for use in impedance matching of transmission lines, e.g., as measured at a conductive node 890 or other electrical connection for an external device.

The conductive node 890 might represent a physical contact for receiving signals of the I/O bus 134 of FIG. 1, for example. As a particular example, the conductive node 890 might be configured to receive a data (DQ) signal, e.g., a signal representative of a digit of data. In this example, the driver 894 may represent a driver of the processor 130 providing that DQ signal, while the resistance 896 may represent an impedance of the signal path between the driver 894 and the conductive node 890. It is noted that the input buffer circuit 500A may represent any digit (e.g., bit) of data of the apparatus 800A. For example, for eight digits of data, the apparatus 800A may include eight input buffer circuits 500A of a similar (e.g., the same) configuration as I/O buffer circuit 500 depicted in FIG. 5A.

The input buffer circuit 500A may further include a second input 539 configured to receive a reference voltage such as VREF. The reference voltage VREF might, as an example, have a voltage level halfway between a voltage level of the voltage node 897 and a voltage level of the voltage node 899, e.g., Vcc/2. The reference voltage VREF might be received from an external device, or it might be generated internal to the apparatus 800A.

The input buffer circuit 500A may further include a first output 551 and a second output 567. The first output 551 and/or the second output 567 might be selectively connected to a register (e.g., cache register 118) for providing data signals indicative of logic levels of the voltage signal received on the first input 537.

Figure 8B:
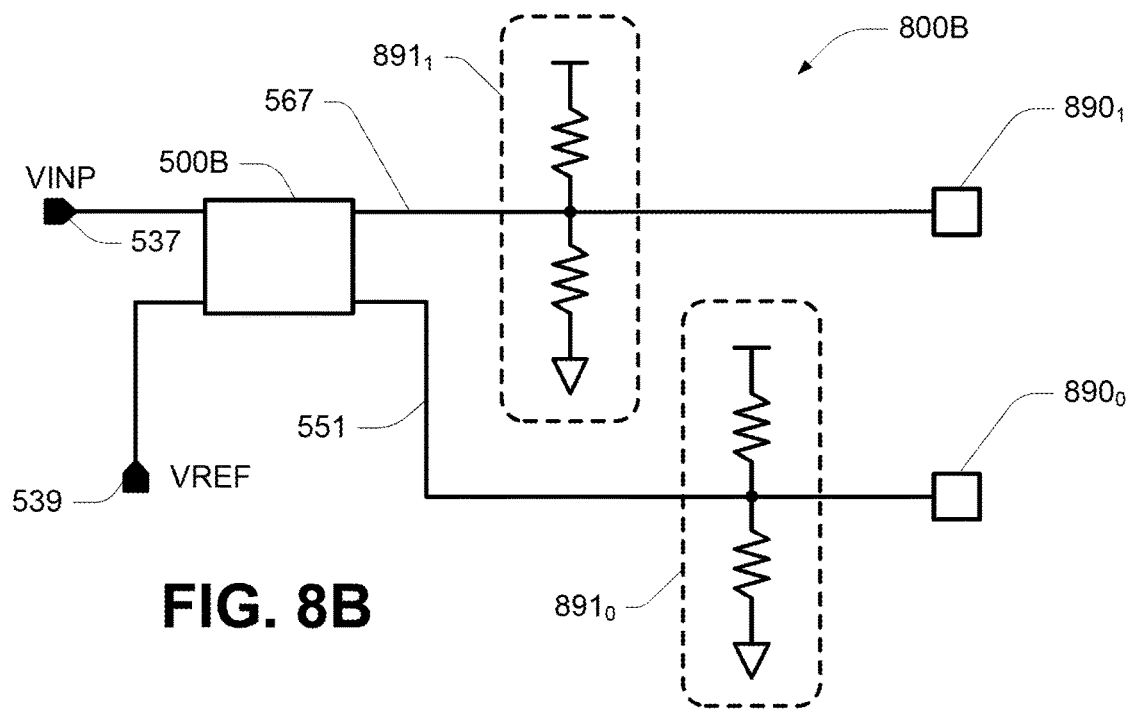
FIG. 8B is a block schematic of an apparatus including an output buffer in accordance with an embodiment.

I/O buffer circuits in accordance with embodiments might also be used as output buffer circuits, where VINP might represent a voltage signal received from internal circuitry. FIG. 8B is a block schematic of an apparatus including an output buffer circuit in accordance with an embodiment.

In particular, FIG. 8B is a block schematic of a portion of an apparatus 800B (e.g., a memory device or other integrated circuit device) having an output buffer circuit 500B in accordance with an embodiment. The output buffer circuit 500B may have a first input 537 configured, for example, to selectively connect to a register (e.g., cache register 118) for receiving data signals indicative of logic levels of data stored in an array of memory cells 104. The output buffer circuit 500B may further include a second input 539 configured to receive a reference voltage such as VREF as discussed with reference to FIG. 8A.

The output buffer circuit 500B may further include a first output 551 and a second output 567. The first output 551 might be connected to a conductive node $890_0$ (e.g., conductive pad or other electrical connection for an external device) through an ODT device $891_0$. The ODT device $891_0$ might have a configuration as described with reference to the ODT device 891 of FIG. 8A. Similarly, the configuration of ODT device $891_0$ is not important to the disclosed embodiments. The conductive node $890_0$ might represent a physical contact for providing signals to the I/O bus 134 of FIG. 1, such as data (DQ) signals for example. In addition, or in the alternative, the second output 567 might be connected to a conductive node $890_1$ (e.g., conductive pad or other electrical connection for an external device) through an ODT device $891_1$. The ODT device $891_1$ might have a configuration as described with reference to the ODT device 891 of FIG. 8A. Similarly, the configuration of ODT device $891_1$ is not important to the disclosed embodiments, and might be eliminated. The conductive node $890_1$ might represent a physical contact for providing signals to the I/O bus 134 of FIG. 1, such as data (DQ) signals for example.

It is noted that the output buffer circuit 500B may represent any digit (e.g., bit) of data of the apparatus 800B. For example, for eight digits of data, the apparatus 800B may include eight output buffer circuits 500B of a similar (e.g., the same) configuration as I/O buffer circuit 500 depicted in FIG. 5A.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. An apparatus, comprising:
   a current generator comprising a first input configured to receive a first voltage signal, comprising a second input configured to receive a second voltage signal, and being configured to generate a current flow between a first output of the current generator and a second output of the current generator responsive to a difference between a voltage level received at its first input and a voltage level received at its second input; and
   a feedback amplifier comprising a first input connected to the first output of the current generator, comprising a second input connected to the second output of the current generator, comprising a first voltage signal node connected to its first input through a first resistance, and comprising a second voltage signal node connected to its second input through a second resistance;
   wherein the feedback amplifier further comprises:
      a first inverter connected in parallel with the first resistance;
      a second inverter connected in parallel with the second resistance; and
      a pair of cross-coupled inverters connected between the first voltage signal node of the feedback amplifier and the second voltage signal node of the feedback amplifier.

2. The apparatus of claim 1, further comprising:
a fifth inverter comprising an input connected to the first voltage signal node and comprising an output; and
a sixth inverter comprising an input connected to the second voltage signal node and comprising an output.

3. The apparatus of claim 2, wherein the output of the fifth inverter is connected to a conductive node configured for communication with an external device.

4. The apparatus of claim 1, wherein the first input of the current generator is connected to a conductive node configured for communication with an external device.

5. The apparatus of claim 4, wherein the second input of the current generator is connected to a node selected from a group consisting of a reference voltage node and a conductive node configured for communication with the external device.

6. The apparatus of claim 1, wherein the current generator is further configured to:
generate a current source at its first output and a current sink at its second output in response to the voltage level received at its first input being higher than the voltage level received at its second input; and
generate a current source at its second output and a current sink at its first output in response to the voltage level received at its second input being higher than the voltage level received at its first input.

7. The apparatus of claim 1, wherein the first inverter comprises an input connected to the first output of the current generator and an output connected to the first voltage signal node, and wherein the second inverter comprises an input connected to the second output of the current generator and an output connected to the second voltage signal node.

8. The apparatus of claim 7, wherein the pair of cross-coupled inverters comprises:
a third inverter comprising an input connected to the output of the first inverter, and comprising an output connected to the output of the second inverter;
a fourth inverter comprising an input connected to the output of the second inverter, and comprising an output connected to the output of the first inverter.

9. The apparatus of claim 8, wherein the first inverter and the fourth inverter are sized to maintain a voltage level of the first voltage signal node lower than the voltage level received at the second input of the current generator when the voltage level received at the first input of the current generator is maintained higher than the voltage level received at the second input of the current generator, and wherein the first inverter and the fourth inverter are further sized to maintain the voltage level of the first voltage signal node higher than the voltage level received at the second input of the current generator when the voltage level received at the first input of the current generator is maintained lower than the voltage level received at the second input of the current generator.

10. The apparatus of claim 8, wherein the second inverter and the third inverter are sized to maintain a voltage level of the second voltage signal node higher than the voltage level received at the second input of the current generator when the voltage level received at the first input of the current generator is maintained higher than the voltage level received at the second input of the current generator, and wherein the second inverter and the third inverter are further sized to maintain the voltage level of the second voltage signal node lower than the voltage level received at the second input of the current generator when the voltage level received at the first input of the current generator is maintained lower than the voltage level received at the second input of the current generator.

11. An apparatus, comprising:
a current generator comprising a first input configured to receive a first voltage signal, comprising a second input configured to receive a second voltage signal, comprising a first output, and comprising a second output;
a first inverter comprising an input connected to the first output of the current generator, and comprising an output;
a second inverter comprising an input connected to the second output of the current generator, and comprising an output;
a first resistance comprising a first end connected to the input of the first inverter, and comprising a second end connected to the output of the first inverter;
a second resistance comprising a first end connected to the input of the second inverter, and comprising a second end connected to the output of the second inverter;
a third inverter comprising an input connected to the output of the first inverter, and comprising an output connected to the output of the second inverter;
a fourth inverter comprising an input connected to the output of the second inverter, and comprising an output connected to the output of the first inverter;
wherein the current generator is configured to generate a current source at its first output and a current sink at its second output in response to a voltage level received at its first input being higher than a voltage level received at its second input; and
wherein the current generator is configured to generate a current source at its second output and a current sink at its first output in response to a voltage level received at its second input being higher than a voltage level received at its first input.

12. The apparatus of claim 11, further comprising:
a conductive node configured for communication with an external device;
wherein the conductive node is connected to the first input of the current generator.

13. The apparatus of claim 12, further comprising:
an on-die termination device;
wherein the conductive node is connected to the first input of the current generator through the on-die termination device.

14. The apparatus of claim 11, further comprising:
a conductive node configured for communication with an external device;
wherein the conductive node is connected to receive a voltage signal indicative of a logic level of the first voltage signal node.

15. The apparatus of claim 14, wherein the voltage signal indicative of the logic level of the first voltage signal node has a logic level different than the logic level of the first voltage signal node.

16. The apparatus of claim 11, wherein the apparatus is configured to receive a top rail supply voltage and a bottom rail reference potential, and wherein the voltage level received at the second input of the current generator is configured to be halfway between the top rail supply voltage and the bottom rail reference potential.

17. The apparatus of claim 16, further comprising:
wherein the first inverter comprises:
a first n-type field-effect transistor (nFET) comprising a control gate connected to the input of the first inverter, a first source/drain connected to a voltage node configured to receive the bottom rail reference potential, and a second source/drain connected to the output of the first inverter; and a first p-type field-effect transistor (pFET) comprising a control gate connected to the input of the first inverter, a first source/drain connected to a voltage node configured to receive the top rail supply voltage, and a second source/drain connected to the output of the first inverter;

wherein the fourth inverter comprises:

a second nFET comprising a control gate connected to the input of the fourth inverter, a first source/drain connected to a voltage node configured to receive the bottom rail reference potential, and a second source/drain connected to the output of the fourth inverter; and a second pFET comprising a control gate connected to the input of the fourth inverter, a first source/drain connected to a voltage node configured to receive the top rail supply voltage, and a second source/drain connected to the output of the fourth inverter;

wherein the first nFET, the second nFET, the first pFET, the second pFET and the first resistance are sized to meet the following conditions while the voltage level received at the first input of the current generator is maintained higher than the voltage level received at the second input of the current generator:

$I_{M2}+I_{R1}=I_{M1}+I_{M3}$;
$0.8*VREF<=V1<=1.2*VREF$; and
$V2<V1$;

wherein the first nFET, the second nFET, the first pFET, the second pFET and the first resistance are sized to meet the following conditions while the voltage level received at the first input of the current generator is maintained lower than the voltage level received at the second input of the current generator:

$I_{M1}+I_{R1}=I_{M2}+I_{M4}$;
$0.8*VREF<=V1<=1.2*VREF$; and
$V2>V1$; and $I_{R1}$=current flow through the first resistance, $I_{M1}$=current flow through the first nFET, $I_{M2}$=current flow through the first pFET, $I_{M3}$=current flow through the second nFET, $I_{M4}$=current flow through the second pFET, V1=a voltage level at the input of the first inverter, V2=a voltage level at the output of the first inverter, and VREF=the voltage level received at the second input of the current generator.

18. The apparatus of claim 17, further comprising:

wherein the second inverter comprises:

a third nFET comprising a control gate connected to the input of the second inverter, a first source/drain connected to a voltage node configured to receive the bottom rail reference potential, and a second source/drain connected to the output of the second inverter; and a third pFET comprising a control gate connected to the input of the second inverter, a first source/drain connected to a voltage node configured to receive the top rail supply voltage, and a second source/drain connected to the output of the second inverter;

wherein the third inverter comprises:

a fourth nFET comprising a control gate connected to the input of the third inverter, a first source/drain connected to a voltage node configured to receive the bottom rail reference potential, and a second source/drain connected to the output of the third inverter; and a fourth pFET comprising a control gate connected to the input of the third inverter, a first source/drain connected to a voltage node configured to receive the top rail supply voltage, and a second source/drain connected to the output of the third inverter; and wherein the third nFET a same size as the first nFET, the fourth nFET has a same size as the second nFET, the third pFET has a same size as the first pFET, the fourth pFET has a same size as the second pFET, and the second resistance has a same size as the first resistance.

19. An memory, comprising:

an array of memory cells;

input/output (I/O) control circuitry configured to receive voltage signals from an external device representing data for storage to the array of memory cells; and a register configured to receive voltage signals from the I/O control circuitry representing the data for storage to the array of memory cells;

wherein the I/O control circuitry comprises:

a conductive node configured to receive the voltage signals from the external device;

a current generator comprising a first input connected to the conductive node, comprising a second input configured to receive a reference voltage signal, comprising a first output, and comprising a second output;

a first inverter comprising an input connected to the first output of the current generator, and comprising an output;

a second inverter comprising an input connected to the second output of the current generator, and comprising an output;

a first resistance comprising a first end connected to the input of the first inverter, and comprising a second end connected to the output of the first inverter;

a second resistance comprising a first end connected to the input of the second inverter, and comprising a second end connected to the output of the second inverter;

a third inverter comprising an input connected to the output of the first inverter, and comprising an output connected to the output of the second inverter;

a fourth inverter comprising an input connected to the output of the second inverter, and comprising an output connected to the output of the first inverter;

a fifth inverter comprising an input connected to the output of the first inverter, and comprising an output connected to the register;

wherein the current generator is configured to generate a current source at its first output and a current sink at its second output in response to a voltage level received at its first input being higher than a voltage level received at its second input; and wherein the current generator is configured to generate a current source at its second output and a current sink at its first output in response to a voltage level received at its second input being higher than a voltage level received at its first input.

20. The memory of claim 19, wherein the I/O control circuitry further comprises a sixth inverter comprising an input connected to the output of the second inverter, and comprising an output connected to the register.

21. The memory of claim 19, wherein the first input of the current generator is connected to the conductive node through an on-die termination device.

* * * * *